United States Patent
Schneegans et al.

(10) Patent No.: US 6,919,269 B2
(45) Date of Patent: Jul. 19, 2005

(54) PRODUCTION METHOD FOR A SEMICONDUCTOR COMPONENT

(75) Inventors: Manfred Schneegans, Vaterstetten (DE); Wolfgang Jäger, Baldham (DE); Ulrike Bewersdorff-Sarlette, Radebeul (DE); Stephan Wege, Weissig (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/477,620

(22) PCT Filed: Apr. 11, 2002

(86) PCT No.: PCT/EP02/04065
§ 371 (c)(1),
(2), (4) Date: Nov. 14, 2003

(87) PCT Pub. No.: WO02/093629
PCT Pub. Date: Nov. 21, 2002

(65) Prior Publication Data
US 2004/0147102 A1 Jul. 29, 2004

(30) Foreign Application Priority Data
May 15, 2001 (DE) .......................... 101 23 510

(51) Int. Cl.[7] .............................................. H01L 21/44
(52) U.S. Cl. .................. 438/652; 438/96; 438/239; 438/244; 438/253; 438/652; 438/656; 438/658; 438/660; 257/65; 257/66; 257/68; 257/71; 257/296; 257/303; 257/306
(58) Field of Search .................. 438/652, 660, 438/96–97, 574–579, 656–658, 239–253, 166–167, 184, 186, 197; 257/64–70, 296–313

(56) References Cited

U.S. PATENT DOCUMENTS

| | | | | |
|---|---|---|---|---|
| 4,417,385 A | * | 11/1983 | Temple | 438/138 |
| 5,681,774 A | * | 10/1997 | Tseng | 438/396 |
| 5,700,734 A | | 12/1997 | Ooishi | |
| 5,792,693 A | * | 8/1998 | Tseng | 438/254 |
| 6,013,569 A | * | 1/2000 | Lur et al. | 438/595 |
| 6,017,819 A | * | 1/2000 | Brigham et al. | 438/657 |
| 6,037,263 A | * | 3/2000 | Chang | 438/712 |
| 6,221,746 B1 | | 4/2001 | Huang et al. | |
| 6,284,636 B1 | * | 9/2001 | Hossain et al. | 438/592 |
| 6,309,928 B1 | * | 10/2001 | Sung et al. | 438/265 |
| 6,485,564 B1 | * | 11/2002 | Liu et al. | 117/95 |
| 6,538,277 B2 | * | 3/2003 | Sung et al. | 257/317 |
| 2001/0024870 A1 | * | 9/2001 | Tanabe et al. | 438/592 |

FOREIGN PATENT DOCUMENTS

EP 0 905 753 3/1999
EP 0 964 437 12/1999

* cited by examiner

*Primary Examiner*—Matthew Smith
*Assistant Examiner*—Granvill Lee
(74) *Attorney, Agent, or Firm*—Fish & Richardson P.C.

(57) ABSTRACT

A method for fabricating a semiconductor component includes: deposition of a polysilicon layer on a substrate, deposition of a precursor layer on the polysilicon layer, and deposition of a protective layer on the precursor layer. A crystalline transformation occurs in the precursor layer at a first temperature to form an electrode layer. The layers are patterned to form an electrode stack, and the polysilicon layer is oxidized at a second temperature such that no crystalline transformation occurs in the electrode layer.

12 Claims, 2 Drawing Sheets a)

$T1 = 900\text{-}1080°C$ b)

c)

d)

$T2 = 800-850°C$ e)

PRODUCTION METHOD FOR A SEMICONDUCTOR COMPONENT

The present invention relates to a method for fabricating a semiconductor component having a substrate and an electrode stack which is arranged on the substrate and includes a polysilicon electrode layer and a tungsten-containing electrode layer above it.

The term substrate is to be understood in the general sense and may therefore comprise both single-layer and multilayer substrates of any desired type.

Although it can be applied to any desired semiconductor components, the present invention as well as the problem on which it is based are explained with reference to gate electrode stacks of dynamic random access memories (DRAMs) using silicon technology.

BACKGROUND

What are known as single-transistor cells are used in dynamic random access memories (DRAMs). These cells comprise a storage capacitor and a select transistor (MOSFET), which connects the storage electrode to the bit line. The storage capacitor may be designed as a trench capacitor or as a stacked capacitor.

To drive the select transistor, a metalically conductive gate electrode stack is placed onto the gate oxide. Typical gate electrode stacks are stacks comprising doped polysilicon and, above it, a tungsten silicide ($WSi_x$) or a tungsten nitride/tungsten sandwich.

Patterning of a gate electrode stack of this type, for example by a plasma etch, by means of an additional silicon nitride capping layer on the upper tungsten-containing electrode layer, together with corresponding gate contacts, provides the metallic connection lines.

The patterned gate electrode stacks are usually subjected to a thermal aftertreatment in such a manner that simultaneously the uncovered side walls are partially oxidized and the resistance in the metal is minimized by targeted phase transformation or grain growth. The thin film of oxide which is thereby formed on the side walls of the polysilicon improves the leakage current characteristics of the transistors and acts as a spacer for the subsequent LDD (lightly doped drain) implantation. The latter sets the transistor parameters over the defined gate length. The metallic phase transformation at typical temperatures of 1000 to 1080° C. leads to a reduction in the resistance and is associated with strong grain growth in the gate metal.

In the process as currently used, the conditioning takes place at between 1000 and 1080° C. after the patterning of the gate electrode stack immediately before the LDD implantation. This known process leads to the following problems.

When tungsten silicide ($WSi_x$) is used, grains grow out laterally beyond the side faces of the gate electrode stack, which have been etched smooth, forming a partial alloy with the polysilicon below. These lateral projections, in particular in future technology generations with a feature size of <170 nm, may lead to short circuits with adjacent metal contacts, since they may be etched open during the contact etch.

DRAM technologies with transistor gate lengths of less than 110 nm require modified cell architectures with lower resistances and connections which are free of short circuits.

The use of tungsten without Si alloy with a tungsten nitride diffusion barrier with respect to the polysilicon below fulfils the requirements relating to the resistance. However, tungsten as gate metal is not suitable for current processes, since during the subsequent processing involved in thermal and oxidation processes, it escapes as a gas or sublimes as $WO_x$ and is precipitated at the chamber inner walls, making it impossible to control the side wall oxidation.

SUMMARY

The object of the present invention is to provide an improved method for fabricating a semiconductor component of the type described in the introduction which is able to prevent $WSi_x$ grains from growing out and to prevent $WO_x$ from being sublimed.

The general idea on which the present invention is based consists in separating the thermal aftertreatment of the gate electrode stack (phase transformation or grain growth in order to reduce the resistance) from the aftertreatment of the polysilicon (side wall oxidation), in two independent process steps.

All the known deposition and etching processes can be retained in the same form. All the subsequent thermal processes can take place at lower temperatures than has hitherto been the case, since the conditioning of the gate metal has been concluded, and this has a beneficial effect on the heat budget.

Particular advantages of conditioning with a combination of tungsten nitride/tungsten result from a lower stack height being required to achieve the same resistance. This results in a less demanding aspect ratio during application of the insulation layer and simplifies subsequent etching processes.

According to a preferred refinement, grain growth and/or phase transformation associated with a reduction in the resistance takes place in the precursor layer at the first temperature.

According to a further preferred refinement, the tungsten-containing precursor layer consists of tungsten silicide, the first temperature lying in the range from 900 to 1080° C.

According to a further preferred refinement, the tungsten-containing precursor layer consists of tungsten metal, with the first temperature lying in the range from 900 to 1080° C.

According to a further preferred refinement, a diffusion barrier layer made from tungsten nitride is provided beneath the tungsten-containing precursor layer made from tungsten metal during the deposition of the layer sequence.

According to a further preferred refinement, the protective layer is formed into a hard mark by means of a lithographic process, and the layer sequence is patterned by means of an etching process using this hard mask.

According to a further preferred refinement, the second temperature lies in the range from 800 to 850° C.

According to a further preferred refinement, the electrode stack is a gate electrode stack which is located on a gate oxide layer of the substrate.

BRIEF DESCRIPTION OF THE DRAWINGS

An exemplary embodiment of the invention is illustrated in the drawings and is explained in more detail in the description which follows.

DETAILED DESCRIPTION

Figure 1:
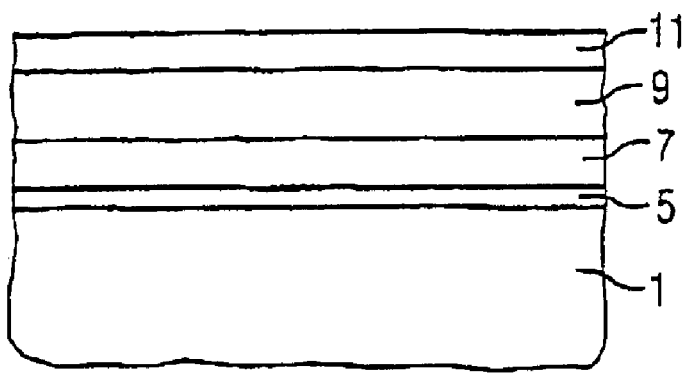
FIGS. 1a–e show the steps of an exemplary embodiment of the fabrication method according to the invention which are essential to gaining an understanding of the invention.
Figure 1:
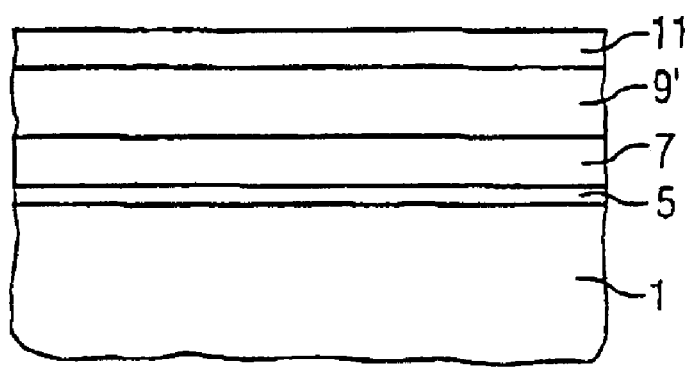
Figure 1:
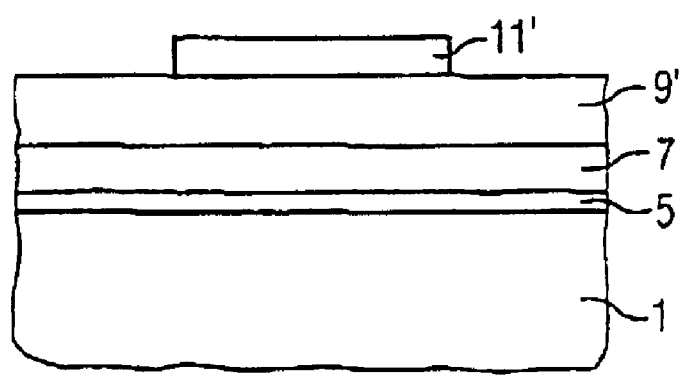
Figure 1:
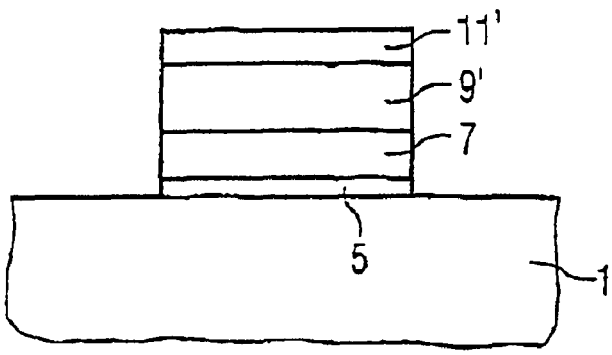
Figure 1:
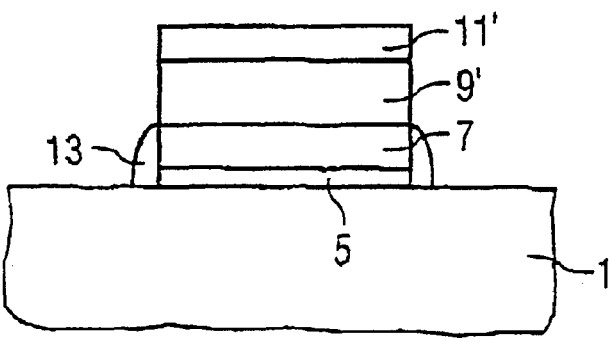

In accordance with FIG. 1a, first of all a substrate 1 is provided, this substrate having active regions (not shown), such as for example source regions and drain regions. First of all, a gate oxide layer 5 is formed on the substrate 1 by means of a standard thermal oxidation process. A doped polysilicon layer 7 is deposited on the gate oxide layer 5, for example by means of the CVD (chemical vapor deposition) process. A tungsten silicide layer 9 is deposited on the polysilicon layer 7 by means of a CVD process.

Figure 2:
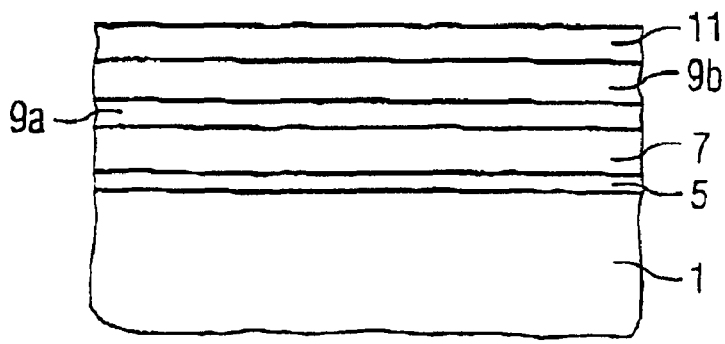
FIG. 2 shows a further exemplary embodiment of the fabrication method according to the invention.

In a further exemplary embodiment as shown in FIG. 2, a tungsten nitride layer 9a is deposited, followed by the deposition of a tungsten layer 9b in the same process chamber.

Finally, a silicon nitride layer 11 is deposited, likewise by means of a CVD process. From here on, the process steps are once again identical for both exemplary embodiments.

In the following process step, which is illustrated in FIG. 1b, a first conditioning step takes place at a first temperature T1 in the range from 900 to 1080° C., preferably 1000° C. This first conditioning step brings about phase transformation associated with a grain growth and a reduction in the resistance of the tungsten silicide layer 9, transforming this precursor layer into the final electrode layer 9'.

In other words, the first conditioning step (900 to 1080° C.) is carried out for phase transformation, grain growth or resistance reduction after all the layers polysilicon, gate metal, silicon nitride have been completely deposited, i.e. with a capping layer above the gate metal, and prior to patterning of the gate electrode stacks. The sublimation of tungsten oxide ($WO_x$) can be prevented by the capping layer. Furthermore, the formation of surface roughness (cavities caused by grain growth), which is inevitable during the phase transformation, and the nitride layer above is prevented. Therefore, in particular there is no silicon nitride in the cavities, which during a subsequent gate stack etch would have a masking action in the cavities and would therefore lead to short circuits.

In the next method step, the silicon nitride layer 11 is patterned to form a hard mask 11' by means of a standard photolithography step, leading to the state shown in FIG. 1c.

This hard mark 11' is then used to form the gate electrode stack from the layer sequence comprising the layers 5, 7, 9' by means of a standard plasma-RIE step. This is illustrated in FIG. 1d. Then, the remaining polysilicon layer 7 is oxidized, in order to form side wall oxide spacers 13, in an oxidation furnace or by means of a rapid thermal oxidation process. This leads to the state shown in FIG. 1e.

The second temperature step takes places at significantly lower temperatures of 800 to 850° C. after the gate stack has been patterned, for the purpose of targeted side wall oxidation of the polysilicon surfaces. Therefore, in the case of tungsten silicide ($WSi_x$), the lateral growth of the metal grains does not occur and the geometry of the pattern is retained, since after the gate stack etch the process of grain size growth or phase transformation in the gate metal has concluded.

The subsequent process steps are well known from the prior art and require no further explanation at this point. In particular, the abovementioned LDD implantation is carried out in a subsequent process step.

Although the present invention has been described above on the basis of a preferred exemplary embodiment, it is not restricted to this embodiment, but rather can be modified in numerous ways.

In particular, the invention can be applied to any desired components and is not limited to gate electrode stacks.

What is claimed is:

1. A method for fabricating a semiconductor component, the method comprising:

providing a substrate, depositing a polysilicon layer on the substrate, depositing a precursor layer on the polysilicon layer, depositing a protective layer on the precursor layer, after depositing the protective layer, causing a crystalline transformation in the precursor layer at a first temperature, the crystalline transformation forming an electrode layer, patterning the polysilicon layer, electrode layer, and protective layer to form an electrode stack, and oxidizing the polysilicon layer at a second temperature such that no crystalline transformation occurs in the electrode layer, the second temperature being less than the first temperature.

2. The method of claim 1 further comprising selecting the precursor layer to include tungsten.

3. The method of claim 1, wherein oxidizing the polysilicon comprises forming a sidewall spacer.

4. The method of claim 1, wherein causing a crystalline transformation includes reducing the resistance in the precursor layer.

5. The method of claim 1, further comprising selecting the precursor layer to include a tungsten silicide material.

6. The method of claim 1, further comprising selecting the first temperature to be between 900° C. and 1080° C.

7. The method of claim 1, further comprising providing a diffusion barrier layer beneath the precursor layer.

8. The method of claim 7, further comprising selecting the diffusion barrier layer to include tungsten nitride.

9. The method of claim 1, further comprising forming a hard mask from the protective layer.

10. The method of claim 9, wherein patterning the layers further comprises etching areas exposed by the hard mask.

11. The method of claim 1, further comprising selecting the second temperature to be between 800° C and 850° C.

12. The method of claim 1, further comprising providing a gate oxide layer between the substrate and the polysilicon layer.

* * * * *